United States Patent [19]
Shinjo et al.

[11] Patent Number: 5,952,824
[45] Date of Patent: Sep. 14, 1999

[54] MAGNETIC DETECTING APPARATUS WITH GIANT MAGNETORESISTIVE SENSING ELEMENT AND LEVEL SHIFTING WAVEFORM PROCESSING CIRCUIT

[75] Inventors: Izuru Shinjo; Yasuyoshi Hatazawa; Naoki Hiraoka; Yutaka Ohashi, all of Tokyo, Japan

[73] Assignee: Mitsubishi Denki Kabushiki Kaisha, Tokyo, Japan

[21] Appl. No.: 08/895,415

[22] Filed: Jul. 16, 1997

[30] Foreign Application Priority Data

Feb. 25, 1997 [JP] Japan .................................. 9-040935

[51] Int. Cl.$^6$ .............................. G01B 7/30; G01P 7/481; H03K 5/01
[52] U.S. Cl. .............................. 324/207.21; 324/207.25; 324/166; 327/510
[58] Field of Search .......................... 324/207.2, 207.21, 324/207.22, 207.25, 174, 173, 166, 252; 327/510, 511

[56] References Cited

U.S. PATENT DOCUMENTS

| | | | |
|---|---|---|---|
| 4,476,439 | 10/1984 | Sato | 330/254 |
| 5,293,125 | 3/1994 | Griffin et al. | 324/207.21 X |
| 5,442,283 | 8/1995 | Vig et al. | 324/207.2 |
| 5,493,219 | 2/1996 | Makino et al. | 324/207.25 |
| 5,574,364 | 11/1996 | Kajimoto et al. | 324/207.21 X |
| 5,729,127 | 3/1998 | Tamura et al. | 324/207.21 X |
| 5,754,042 | 5/1998 | Schroeder et al. | 324/207.21 X |
| 5,789,919 | 8/1998 | Umemoto et al. | 324/207.21 |

FOREIGN PATENT DOCUMENTS

| | | |
|---|---|---|
| A-44 07 565 | 9/1994 | Germany . |
| A-44 35 678 | 4/1995 | Germany . |
| 1-195586 | 7/1989 | Japan . |

OTHER PUBLICATIONS

Graeger, V. and Petersen, A., "Magnetoresistiver Drehzahlsensor—Zvrerläsig und Preiswert," Elektronik 24/1992, S. 48 bis 52 (No Month).

*Primary Examiner*—Josie Ballato
*Assistant Examiner*—T. R. Sundaram
*Attorney, Agent, or Firm*—Sughrue, Mion, Zinn, Macpeak & Seas, PLLC

[57] ABSTRACT

A magnetic detecting apparatus is capable of performing accurate waveform processing without being affected by noise signals or the like, the level shifting circuit thereof having a fixed voltage shift so as to be free of varying amplitudes of analog signals. Waveform shaping circuitry for turning an analog signal detected from a giant magnetoresistive element into a pulse signal includes: the level shifting circuit for generating an amplified voltage (V1) of analog signals and a voltage (V2) which is higher than the voltage (V1) and a voltage (V3) which is lower than the voltage (V1); a circuit which alternately retains the minimum value of the voltage (V2) and the maximum value of the voltage (V3) as a reference voltage; and a comparator circuit which compares a voltage resulting from adding a hysteresis to the voltage (V1) with the reference voltage and issues a pulse signal. The level shifting circuit is constituted by resistors inserted between the output terminal of the voltage (V1) and the output terminals of the voltages (V2, V3), and constant-current circuits connected in series with the resistors.

5 Claims, 11 Drawing Sheets

MAGNETIC DETECTING APPARATUS WITH GIANT MAGNETORESISTIVE SENSING ELEMENT AND LEVEL SHIFTING WAVEFORM PROCESSING CIRCUIT

BACKGROUND OF THE INVENTION

1. Field of the Invention

The present invention relates to a magnetic detecting apparatus that employs a giant magnetoresistive element to issue a pulse signal in response to the movement of a magnetic object, e.g., the number of revolutions of a magnetic rotating body and, more particularly, to a magnetic detecting apparatus that prevents malfunctions in a waveform processing circuit attributable to level fluctuations, superimposed noises, etc. in the analog signals from the giant magnetoresistive element, thereby achieving higher accuracy and reliability.

2. Description of Related Art

There is well known a magnetic detecting apparatus for detecting the rotation of a magnetic rotating body such as the crankshaft of an internal-combustion engine. It is also widely known that a giant magnetoresistive element, which exhibits high detection sensitivity, is used as a magnetic detecting head.

This type of magnetic detecting apparatus is equipped with a waveform processing circuit for waveform-shaping the analog signals issued from the giant magnetoresistive element into pulse signals so as to output pulse signals based on the number of revolutions.

FIG. 4 is a side view illustrative of a magnetic detecting apparatus, e.g., a rotation detecting apparatus, which incorporates a typical waveform processing circuit; it outlines the relative position relationship between a magnetic body 100 which rotates in the direction of arrow and a rotation detecting apparatus 101.

In FIG. 4, the magnetic body 100 to be detected is provided as an integral part of a rotating shaft such as a crankshaft; it has projected sections 100a and recessed sections 100b formed alternately on the outer periphery thereof. The rotation detecting apparatus 101 is disposed so that it is opposed to the magnetic body 100 with a predetermined gap G therebetween.

FIG. 5 is a sectional view outlining the structure of the rotation detecting apparatus 101 in FIG. 4.

In FIG. 5, the rotation detecting apparatus 101 is equipped with a magnetic detection head which is constituted by a permanent magnet 103 and an IC 104 and which is disposed on the surface facing against the magnetic body 100.

The IC 104 incorporates a giant magnetoresistive element and a waveform processing circuit (which will be discussed later) which are combined into one piece; the giant magnetoresistive element is disposed to be opposed to the magnetic body 100, and the waveform processing circuit converts the analog signals received from the giant magnetoresistive element into pulse signals and outputs the pulse signals.

The permanent magnet 103 is disposed at the rear of the IC 104 to apply a bias magnetic field to the giant magnetoresistive element in the IC 104.

FIG. 6 is a perspective view illustrative of the relative position relationship between the magnetic body 100 and the rotation detecting apparatus 101 shown in FIG. 4.

In FIG. 6, a giant magnetoresistive element 20 placed on the IC 104 is composed of line-shaped segments 20a through 20d which are divided into two pairs and which are provided to improve the magnetic detection sensitivity.

Of the segments 20a through 20d, one pair of the segments 20a and 20b are positioned on the front with respect to the direction of the rotation of the magnetic body 100 (see the arrow), while the other pair of the segments 20c and 20d are positioned on the rear with respect to the direction of the rotation of the magnetic body 100.

FIG. 7 is a circuit diagram showing the connection of the respective segments 20a through 20d constituting the giant magnetoresistive element 20.

In FIG. 7, the segments 20a through 20d constitute two pairs of series circuits to include the segments of each of the aforesaid two pairs; the respective series circuits are connected in parallel between a power supply Vcc and ground to form a bridge circuit 14.

A midpoint 14a of one series circuit which include the segments 20a and 20d in the bridge circuit 14 and a midpoint 14b of the other series circuit which includes the segments 20c and 20b provide output terminals through which analog signals A1 and A2 are output as the magnetic body 100 rotates.

FIG. 8 shows the curves illustrative of the resistance values in ohms (Ω) of the giant magnetoresistive element 20 which change as the field magnetic in oersteds (Oe) changes.

In FIG. 8, the resistance value of the giant magnetoresistive element 20 markedly changes in comparison with a regular magnetoresistive element when the external magnetic field changes; for instance, it increases or decreases approximately 250 Ω, i.e. 10% or more, for a resistance value of about 2000 Ω, and it exhibits hysteresis in relation to the changing direction of the magnetic field.

The aforesaid giant magnetoresistive element 20 is described, for example, in "Magnetoresistance Effect of Synthetic Lattice" (page 813 through page 821, No. 51991, Vol. 15, Japan Applied Magnet Society Journal).

According to the foregoing literature, the giant magnetoresistive element 20 can be constructed by a laminated body known as a synthetic lattice film, composed by alternately stacking magnetic layers and nonmagnetic layers that are a few angstroms to a few tens of angstroms (Å).

The giant magnetoresistive element 20 employs, as its material, (Fe/Cr)n, (permalloy/Cu/Co/Cu)n, (Co/Cu)n, etc.

FIG. 9 and FIG. 10 are explanatory diagrams illustrative of the relationship between the magnetic body 100 and the waveforms of the analog signals A1 and A2; FIG. 9 shows a case wherein the gap G between the magnetic body 100 and the magnetic detection head is large, whereas FIG. 10 shows a case wherein the gap G is small.

In FIG. 9 and FIG. 10, the solid lines denote the waveforms of the analog signal A1 output through the midpoint 14a of the bridge circuit 14, whereas the chain lines denote the waveforms of the analog signal A2 output through the midpoint 14b.

Referring now to FIG. 4 through FIG. 10, the operation of a typical rotation detecting apparatus will be outlined.

As shown in FIG. 4 through FIG. 6, the permanent magnet 103 and the magnetic body 100 are disposed with the IC 104 between them; as the magnetic body 100 rotates, the projected sections 100a and the recessed sections 100b of the magnetic body 100 are alternately opposed to the permanent magnet 103.

Hence, the magnetic field applied to the IC 104 increases and decreases alternately as the magnetic body 100 rotates.

More specifically, the magnetic field applied to the IC 104 increases when the projected sections 100a face against the magnetic detection head because the permanent magnet 103 and the magnetic body 100 are closer to each other, whereas it decreases when the recessed sections 100b face against the magnetic detection head because the permanent magnet 103 and the magnetic body 100 are farther away from each other.

In this manner, the magnetic flux intersecting with the giant magnetoresistive element 20 on the IC 104 changes; therefore, the resistance values of the respective segments 20a through 20d vary as shown in FIG. 8 according to the direction and magnitude of the magnetic field applied.

Hence, the analog signals A1 and A2 as shown in FIG. 9 or FIG. 10 are generated at the output terminals, i.e., the midpoints 14a and 14b of the bridge circuit 14 shown in FIG. 7, as the magnetic body 100 rotates.

The fluctuating voltage levels of the analog signals A1 and A2 change according to the size of the gap G as shown in FIG. 9 and FIG. 10, and therefore, they change according primarily to the shapes of the magnetic body 100 and the rotation detecting apparatus 101 and the variations in the installed section, not shown, of the rotation detecting apparatus 101.

FIG. 11 shows the waveforms illustrating the operation for shaping the analog signal A received from the giant magnetoresistive element 20 into the pulse signal P.

As previously mentioned, since the giant magnetoresistive element 20 exhibits hysteresis as shown in FIG. 8, the analog signal A indicated by the solid line has a hill VH and a valley VL which are of relatively high levels and of extremely steep slopes, i.e., a high changing rate, corresponding to the ends of the projecting section 100a of the magnetic body 100.

Therefore, the binarized pulse signal P can be obtained by comparing the analog signal A with a reference voltage signal V14 indicated by the dashed line, by employing a well-known waveform processing circuit which will be discussed later.

The voltage level of the pulse signal P switches between high level and low level corresponding to the ends of the projected sections 100a.

FIG. 12 is a circuit diagram illustrative of a conventional waveform processing circuit described in, for example, Japanese Examined Patent Publication No. 5-70191; and FIG. 13 shows the waveforms of the voltage signals in FIG. 12.

In FIG. 12, an amplifier circuit 1 amplifies the analog signal A and outputs an analog voltage signal V12.

A level shifting circuit 4 connected to the output terminal of the amplifier circuit 1 is composed of resistors R12, R11, and R13 inserted in series between the output terminal of the amplifier circuit 1 and ground; it outputs a maximum level voltage signal V12 through one end of the resistor R12, a medium level voltage signal V11 through the junction of the resistors R12 and R11; and a minimum level voltage signal V13 through the junction of the resistors R11 and R13.

The voltage signal V11 is set so that it is lower than the voltage signal V12 issued from the amplifier circuit 1 by a predetermined voltage which is determined by the resistance ratio of the resistors R11 through R13; and the voltage signal V13 is set so that it is lower than the voltage signal V11 by a predetermined voltage which is determined by the resistance ratio of the resistors R11 through R13.

A voltage retaining circuit 5, which generates the reference voltage signal V14 according to the voltage signals V12 and V13, is equipped with a comparator 22 that retains the minimum value of the maximum level voltage signal V12, a comparator 23 that retains the maximum value of the minimum level voltage signal V13, diodes D2 and D3 inserted to the output terminals of the comparators 22 and 23, respectively, and a capacitor C inserted between the ends of the diodes D2 and D3 and ground.

The voltage signal V12 is applied to a non-inverting input terminal (+) of the comparator 22, the output terminal of the comparator 22 is connected to the cathode of the diode D2, and the anode of the diode D2 is connected to one end of the capacitor C and an inverting input terminal (−) of the comparator 22.

The voltage signal V13 is applied to a non-inverting input terminal (+) of the comparator 23, the output terminal of the comparator 23 is connected to the anode of the diode D3, and the cathode of the diode D3 is connected to one end of the capacitor C and an inverting input terminal (−) of the comparator 23.

One end of the capacitor C alternately retains the minimum value of the voltage signal V12 and the maximum value of the voltage signal V13 and output them as the reference voltage signal V14.

A comparator circuit 6 compares the medium level voltage signal V11 with the reference voltage signal V14 to output the pulse signal P obtained by binarizing the voltage signal V11.

At this point, a hysteresis generating circuit 10 provided at the input terminal of the comparator circuit 6 adds to the voltage signal V11 and applies the result, as the voltage signal V11b, to the non-inverting input terminal (+) of the comparator circuit 6.

The hysteresis generating circuit 10 is constituted by a resistor inserted between the voltage signal V11 and the non-inverting input terminal (+) of the comparator circuit 6, and by a resistor inserted between the output terminal and the non-inversion input terminal (+) of the comparator circuit 6.

A starting circuit 25 connected to the non-inverting input terminal (+) of the comparator circuit 6 prohibits the operation of the comparator circuit 6 for a predetermined period of time immediately after start-up.

The conventional waveform processing circuit shown in FIG. 12 alternately retains the minimum values of the voltage signal V12 and the maximum values of the voltage signal V13 to provide the reference voltage signal V14 indicated by the dashed line in FIG. 13.

In the comparator 6, the pulse signal P is obtained, the level of which is switched each time the voltage signal V11b intersects with the reference voltage signal V14.

However, when the level shifting circuit 4 is composed only of the resistors R11 through R13, the predetermined voltage shifting amount among the respective voltage signals V11 through V13 unavoidably varies according to the level of the analog signals issued from the amplifier circuit 1.

More specifically, as shown in FIG. 13, when the amplitude level of the analog signal is relatively high, an area wherein the voltage shift amount is smaller is generated in the vicinity of zero volt, the area being an area B indicated by the chain line, shows very small intervals among the voltage signals V11b, V12, and V13. This leads to smaller voltage differences of the voltage signal V11b and the reference voltage signal V14 between the input terminals of the comparator circuit 6.

FIG. 14 shows a waveform diagram of an enlarged view of area B indicated by the chain line shown in FIG. 13; it illustrates the waveform observed during a period in which the minimum value of the voltage signal V12 (the pulse signal P is at the low level) is retained as the reference voltage signal V14.

As shown in FIG. 14, when the voltage difference between the voltage signal V11b and the reference voltage signal V14 is small, if a noise signal VN that exceeds the voltage difference is superimposed, then the comparator circuit 6 inevitably outputs a pulse signal P that includes a malfunction signal PN based on the noise signal VN.

FIG. 15 shows the waveform observed when the amplitude level of the analog signal output from the amplifier circuit 1 is low; it illustrates the waveform observed during a period in which the maximum value of the voltage signal V13 (the pulse signal P is at the high level) is retained as the reference voltage signal V14.

In this case, the amplitude level of the analog signal, i.e., the voltage signal V11b, is lower than the voltage shift amount.

As shown in FIG. 15, if the amplitude level of the voltage signal V11b is low in relation to the voltage shift between the voltage signal V11b and the reference voltage signal V14, then the voltage difference between the input terminals of the comparator circuit 6 increases accordingly. As a result, the voltage signal V11b no longer intersects with the reference voltage signal V14, indicated by the dashed line, making it impossible to drop the pulse signal P from the comparator circuit 6 down to the low level.

When the hysteresis generating circuit 10 is constructed only by the resistors as shown in FIG. 12, the hysteresis width added to the voltage signal V11b depends on the voltage signal V11 and the level of the pulse signal P, and it is determined by the resistance voltage ratio of the voltage signal V11 and the pulse signal P.

However, the pulse signal P which has been subjected to waveform processing has a fixed value of either the high or low level, whereas the levels of the analog signal A and the voltage signal V11 change according to various conditions; therefore, the hysteresis width, which depends on the resistance voltage ratio, also changes.

If the hysteresis width of the voltage signal V11b supplied to the comparator circuit 6 varies, then there is a danger that the comparator circuit 6 may output the malfunction signal as illustrated in FIG. 14 or prevent the waveform processing from being implemented as shown in FIG. 15.

Further, as shown in FIG. 12, leakage current I4 flows from the inverting input terminal (−) of the comparator circuit 6 to the capacitor C; therefore, the reference voltage signal V14 increases with time when the voltage retaining state remains unchanged.

FIG. 16 is a waveform diagram illustrating the reference voltage signal V14 in the zone wherein the maximum value of the voltage signal V13 is retained.

In FIG. 16, the reference voltage signal V14, which is indicated by the dashed line, from the voltage retaining circuit 5 continues to rise due to the influences of the leakage current I4 even in the constant-level zone of the voltage signal V13.

The influences of the leakage current I4 cannot be ignored when the frequency of the analog signal A is low, and the voltage retaining circuit 5 cannot retain an accurate reference voltage signal V14, resulting in the malfunction of the comparator circuit 6.

Thus, in the conventional magnetic detecting apparatus, the level shifting circuit 4 is constituted only by the resistors R11 through R13 and the voltage shifting amount varies according to the level of the analog signal. Hence, when the amplitude of the analog signal is large as illustrated in FIG. 13, if the noise signal VN (see FIG. 14) is superimposed in the area B wherein the voltage shifting amount is small, then the problem arises in that the comparator circuit 6 issues the malfunction signal PN.

Further, as shown in FIG. 15, when the level of the analog signal is high and the amplitude thereof is small, the voltage shifting amount increases, presenting a problem in that the comparator circuit 6 cannot carry out the waveform processing.

There has been another problem: since the hysteresis generating circuit 10 is composed only of the resistors, the hysteresis width added to the voltage signal V11b varies according to diverse conditions, causing the comparator circuit 6 to malfunction.

There has been still another problem: when subjecting the analog signal A of a low frequency to the waveform processing, the reference voltage signal V14 of the voltage retaining circuit 5 inevitably changes due to the leakage current I4 from the comparator circuit 6 as illustrated in FIG. 16, preventing an accurate pulse signal P from being generated.

SUMMARY OF THE INVENTION

The present invention has been made with a view toward solving the problems described above, and it is an object thereof to provide a magnetic detecting apparatus that permits accurate waveform processing free from the influences of noise signals or the like by setting the voltage shifting amount of a level shifting circuit to a fixed value rather than depending on the level of an analog signal.

It is another object of the present invention to provide a magnetic detecting apparatus which permits accurate waveform processing by setting the hysteresis width of a hysteresis generating circuit to a fixed value.

It is still another object of the present invention to provide a magnetic detecting apparatus which suppresses the influences of the leakage current from a comparator circuit so as to permit accurate waveform processing even for an analog signal of a low frequency.

To these ends, according to one aspect of the present invention, there is provided a magnetic detecting apparatus equipped with: a giant magnetoresistive element disposed to be opposed to a magnetic body, a magnet for applying a bias magnetic field to the giant magnetoresistive element, and a waveform processing circuit for waveform-shaping an analog signal, which is output from the giant magnetoresistive element as the magnetic body moves, into a pulse signal; wherein the waveform processing circuit includes an amplifier circuit for amplifying the analog signal obtained from the giant magnetoresistive element in synchronization with the movement of the magnetic body; a level shifting circuit connected to an output terminal of the amplifier circuit that generates a first voltage signal output from the amplifier circuit, a second voltage signal higher than the first voltage signal by a first predetermined voltage, and a third voltage signal lower than the first voltage signal by a second predetermined voltage; a voltage retaining circuit that alternately retains the minimum value of the second voltage signal and the maximum value of the third voltage signal as a reference voltage signal; and a comparator circuit that compares the first voltage signal with the reference voltage signal and issues a pulse signal; the level shifting circuit being composed of first and second resistors which are respectively inserted, between the output terminal of the first voltage signal and the output terminals of the second and third voltage signals, to correspond to the first and second predetermined voltages, and a constant-current circuit connected in series to the first and second resistors.

According to another aspect of the present invention, there is provided a magnetic detecting apparatus equipped with: a hysteresis generating circuit composed of a resistor inserted between the output terminal of the first voltage signal and the input terminal of the comparator circuit, a constant-current circuit inserted between one end of the resistor and ground, and a switching circuit connected in series to the constant-current circuit; wherein the switching circuit is closed by an output signal of the comparator circuit, which output signal corresponds to the zone wherein the minimum value of the second voltage signal is retained, so that the voltage level of the first voltage signal supplied to the comparator circuit is set to a voltage signal lower than the first voltage signal by a third predetermined voltage, and the third predetermined voltage is set to a level lower than the second predetermined voltage.

According to yet another aspect of the present invention, there is provided a magnetic detecting apparatus equipped with: a switching circuit inserted between the output terminal of the voltage retaining circuit and ground, and a discharging circuit constituted by voltage limiting means connected in series with the switching circuit; wherein the switching circuit is closed by an output signal of the comparator circuit, which output signal corresponds to the zone wherein the maximum value of the third voltage signal is retained.

The voltage limiting means of the magnetic detecting apparatus in accordance with the present invention is constituted by a constant-current circuit.

The voltage limiting means of the magnetic detecting apparatus in accordance with the present invention is constituted by a resistor.

DESCRIPTION OF THE PREFERRED EMBODIMENTS

First Embodiment

Figure 1:
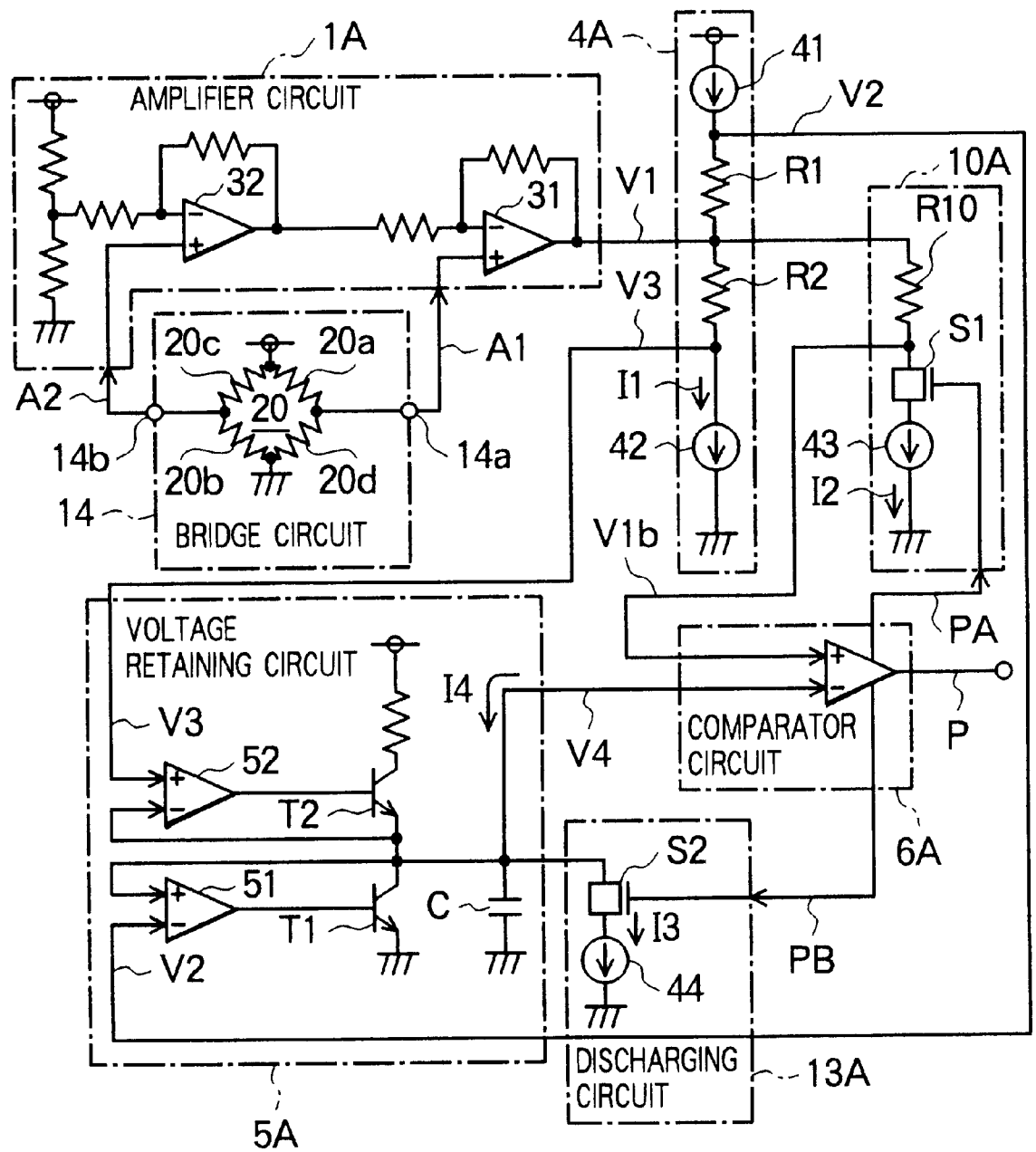
FIG. 1 is a circuit diagram illustrative of the essential section of a first embodiment of the present invention.
Figure 5:
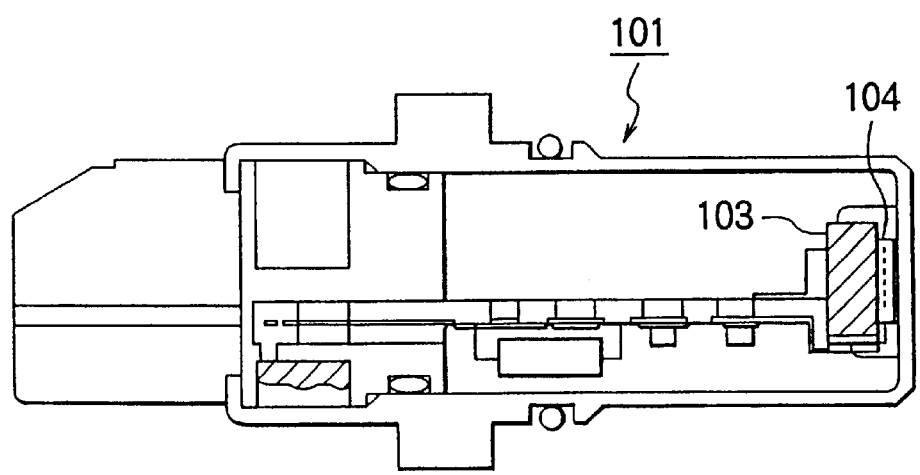
FIG. 5 is a sectional view schematically illustrating the internal configuration of the magnetic detection head shown in FIG. 4.
Figure 6:
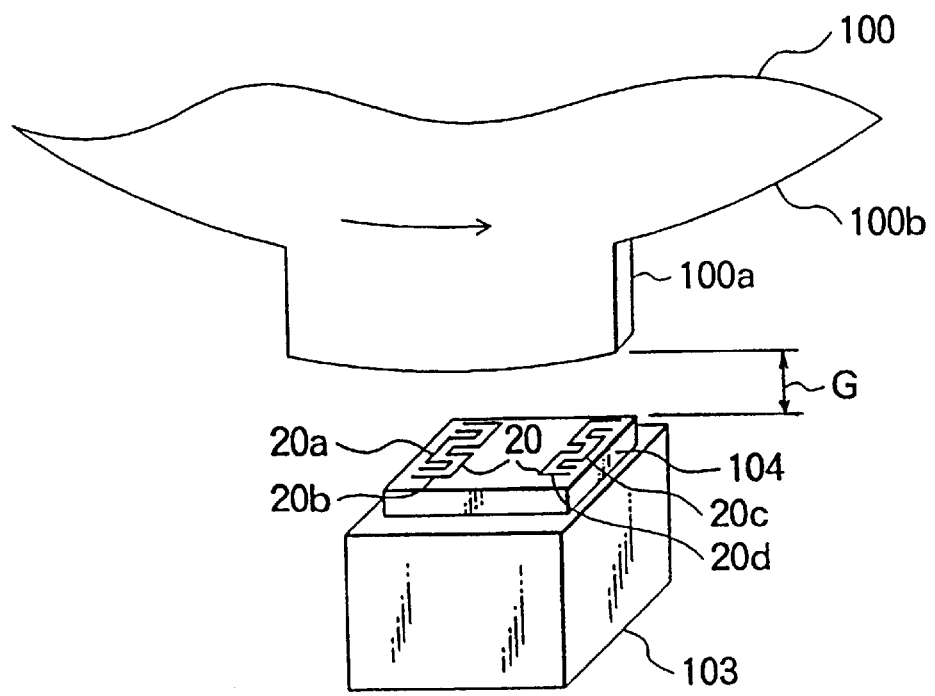
FIG. 6 is a perspective enlarged view of the essential section of the rotation detecting apparatus of FIG. 4.
Figure 7:
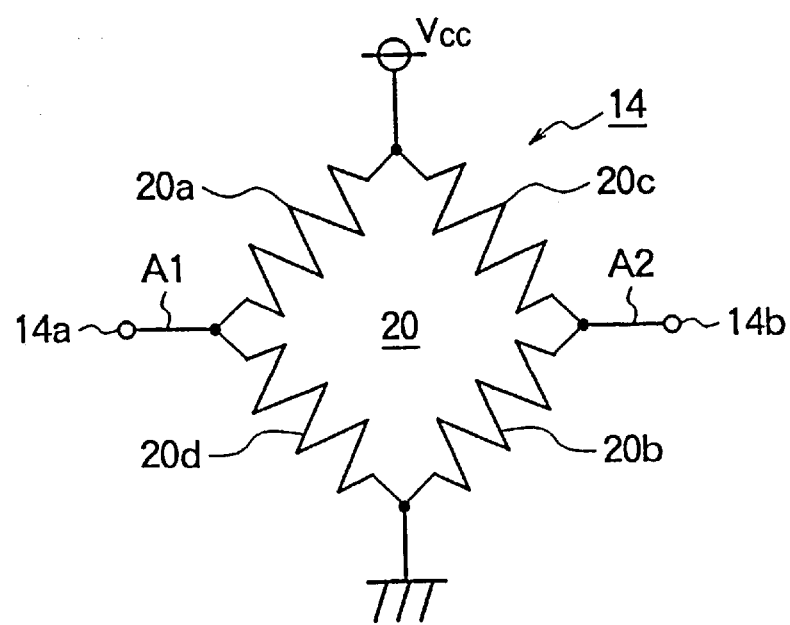
FIG. 7 is a circuit diagram showing the connection of a bridge circuit of a giant magnetoresistive element shown in FIG. 6.
Figure 8:
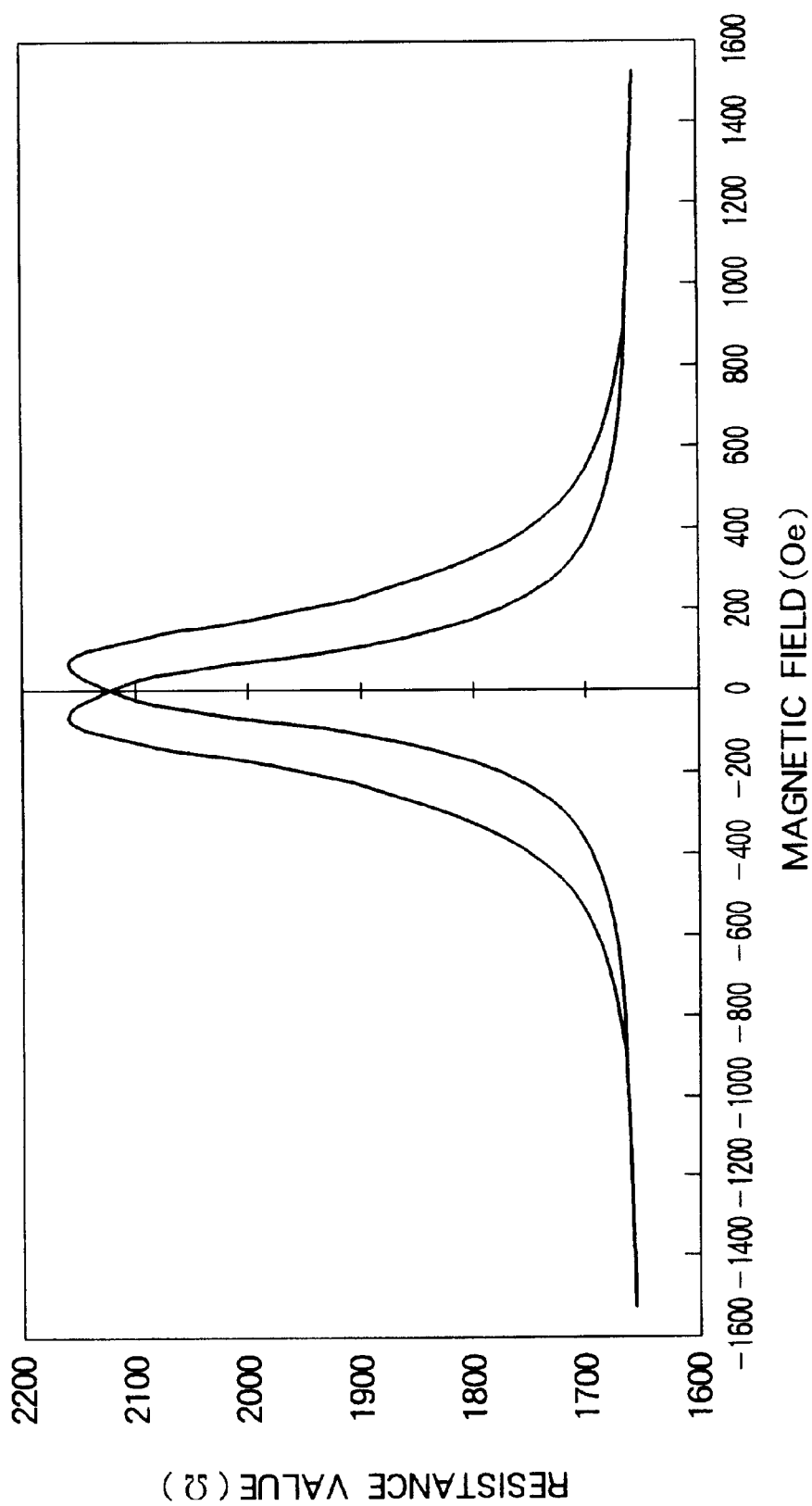
FIG. 8 is a characteristic diagram illustrative of the changes in the resistance value of a typical giant magnetoresistive element in relation to magnetic field.

A first embodiment of the present invention will be described with reference to the accompanying drawings. FIG. 1 is a circuit diagram showing the essential section, namely, a waveform processing circuit, of the first embodiment of the invention; the configuration not shown is as illustrated in FIG. 4 through FIG. 6.

In FIG. 1, the same configuration as that previously described will be assigned like reference numerals and the details thereof will be omitted.

Figure 4:
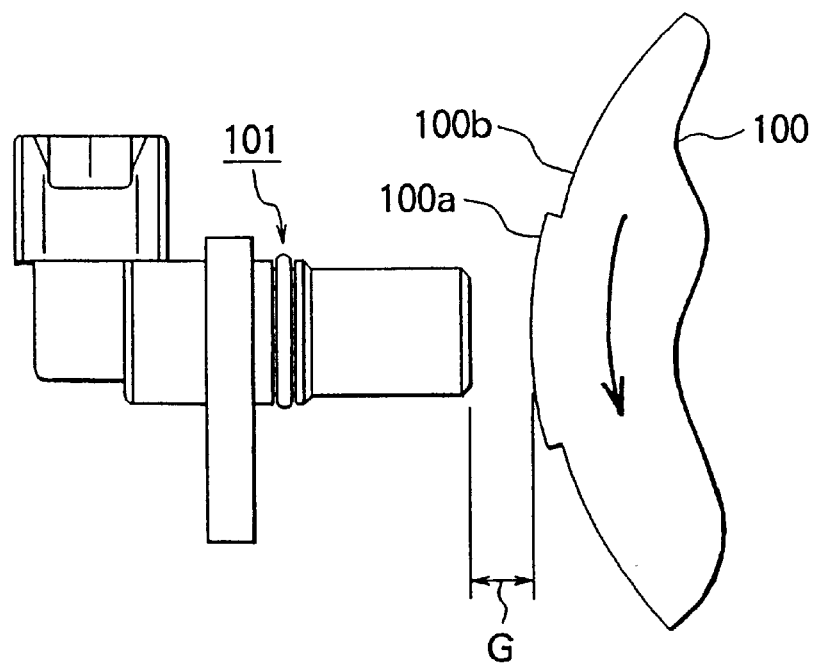
FIG. 4 is a side view schematically illustrating a rotation detecting apparatus as a typical magnetic detecting apparatus.

In this embodiment, an amplifier circuit 1A is composed of a two-stage differential amplifier circuit which includes operational amplifiers 31 and 32; it amplifies the DC voltage and AC voltage of analog signals A1 and A2 received from a giant magnetoresistive element 20 in synchronization with the movement of a magnetic body 100 (see FIG. 4).

The operational amplifier 32 in the front stage in the amplifier circuit 1A amplifies an analog signal A2 issued from a midpoint 14b of a bridge circuit 14, while the operational amplifier 31 in the rear stage positioned at the output terminal end of the amplifier circuit 1A differentially amplifies the voltage difference between the analog signal A1 and the analog signal A2 and outputs it as a voltage signal V1.

A comparator circuit 6A outputs a pulse signal P that has undergone waveform processing, and it also issues a pulse signal PA which has an opposite polarity from that of the pulse signal P and a pulse signal PB which has the same polarity as that of the pulse signal P.

A level shifting circuit 4A connected to the output terminal of the amplifier circuit 1A generates a voltage signal V1 output from the amplifier circuit 1A, a voltage signal V2 higher than the voltage signal V1 by a first predetermined voltage, and a voltage signal V3 lower than the first voltage signal V1 by a second predetermined voltage.

The level shifting circuit 4A is equipped with: a resistor R1 inserted between the output terminal of the voltage signal V1 and the output terminal of the voltage signal V2; a resistor R2 inserted between the output terminal of the voltage signal V1 and the output terminal of the voltage signal V3; a constant-current circuit 41 connected in series to the power supply end of the resistor R1; and a constant-current circuit 42 connected in series to the ground end of the resistor R2; it supplies constant current I1 toward the ground to set levels of the respective voltage signals V1 through V3.

The resistor R1 corresponds to the amount of the voltage shift, namely, the first predetermined voltage, between the voltage signals V1 and V2; and the resistor R2 corresponds to the amount of the voltage shift, namely, the second predetermined voltage, between the voltage signals V1 and V3.

A hysteresis generating circuit 10A that periodically adds hysteresis to the voltage signal V1 is provided with: a resistor R10 inserted between the output terminal of the voltage signal V1 and the non-inverting input terminal (+) of a comparator circuit 6A; a constant-current circuit 43 inserted between one end of the resistor R10 and ground; and a switching circuit, i.e., an analog switch, SI connected in series to the constant-current circuit 43.

The switching circuit S1 is closed, i.e., turned ON, by the pulse signal PA which corresponds to the zone wherein the minimum value of the voltage signal V2 is retained; it supplies the constant current I2 toward ground to set the voltage level of a voltage signal V1b, applied to the comparator circuit 6A, to a value lower than the voltage signal V1 by a third predetermined voltage, i.e. by hysteresis width.

The hysteresis width, i.e. the third predetermined voltage, of the voltage signal V1b is set to a level that is lower than the voltage difference, i.e. the second predetermined voltage, between the voltage signals V1 and V3.

Thus, the hysteresis generating circuit 10A issues, through one end of the resistor R10, the voltage signal V1b that is lower than the voltage signal V1 by the predetermined voltage, i.e. by the hysteresis width, when the switching circuit S1 is closed.

A voltage retaining circuit 5A for generating a reference voltage signal V4 is constructed by: a comparator 51 wherein the voltage signal V2 of the maximum level is applied to an inverting input terminal (−); a comparator 52 wherein the voltage signal V3 of the minimum level is applied to a non-inverting input terminal (+); an emitter-grounded transistor T1 which uses the output signals of the comparator 51 as the base inputs thereof; a transistor T2 which uses the output terminal of the comparator 52 as the base inputs thereof and the power supply as the collector inputs thereof; and a capacitor C inserted between the junction of the transistors T1 and T2 and ground.

The voltage retaining circuit 5A alternately retains the minimum values of the voltage signal V2 and the maximum values of the third voltage signal V3 at one end of the capacitor C and it applies them as the reference voltage signal V4 to the inverting input terminal of the comparator circuit 6A.

A discharging circuit 13A for discharging leakage current I4 to ground is equipped with: a switching circuit, i.e. an analog switch, S2 inserted between the output terminal of the voltage retaining circuit 5A, i.e. one end of the capacitor C, and ground; and a constant-current circuit 44 serving as a voltage limiting means connected in series to the switching circuit S2.

The switching circuit S2 in the discharging circuit 13A is closed, i.e. turned ON, by a pulse signal PB which corresponds to the zone wherein the maximum value of the voltage signal V3 is retained; it discharges the leakage current I4 as constant current I3 to ground so as to prevent the reference voltage signal V4 from rising, thereby holding the reference voltage signal V4 approximately at a fixed value.

The constant current I3 is set to an extremely small current value corresponding to the extremely small leakage current I4; therefore, a very small circuit is used for the constant-current circuit 44.

Thus, the comparator circuit 6A compares the voltage signal V1b received through the resistor R10 in the hysteresis generating circuit 10A with the reference voltage signal V4 from which the influences of the leakage current I4 have been removed via the discharging circuit 13A, and issues the pulse signal P.

The comparator circuit 6A also applies the pulse signal PA which has the opposite polarity from that of the pulse signal P to the switching circuit S1 in the hysteresis circuit 10A and applies the pulse signal PB which has the same polarity as that of the of pulse signal P to the switching circuit S2 in the discharging circuit 13A.

Referring now to the waveforms shown in FIG. 2, and FIG. 4 through FIG. 6, and FIG. 8 through FIG. 10, the operation of the first embodiment of the present invention will be described.

Figure 9:
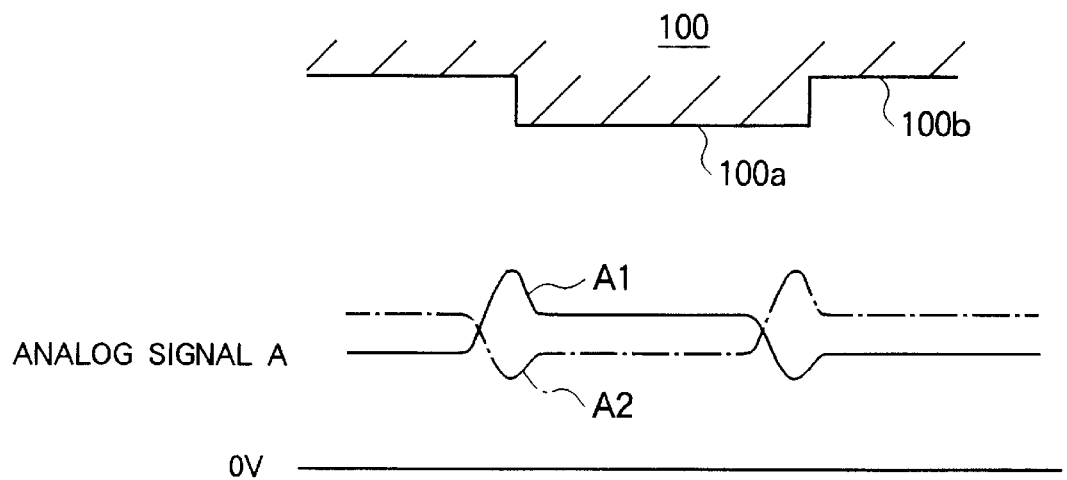
FIG. 9 is a waveform diagram illustrative of the analog signals issued from the respective midpoints of the bridge circuit of FIG. 7 observed when the gap relative to a magnetic body is large.
Figure 10:
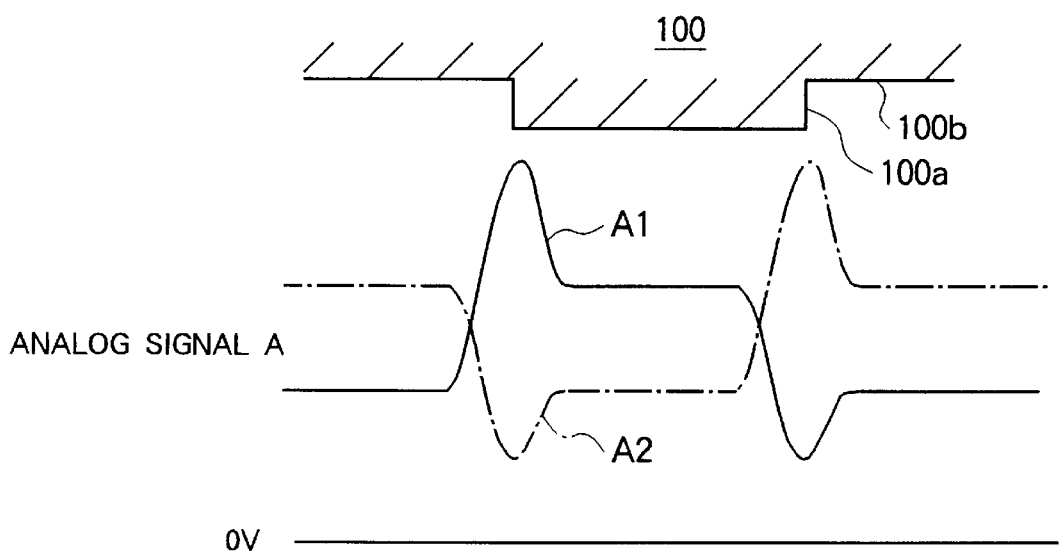
FIG. 10 is a waveform diagram illustrative of the analog signals issued from the respective midpoints of the bridge circuit of FIG. 7 observed when the gap relative to a magnetic body is small.
Figure 11:
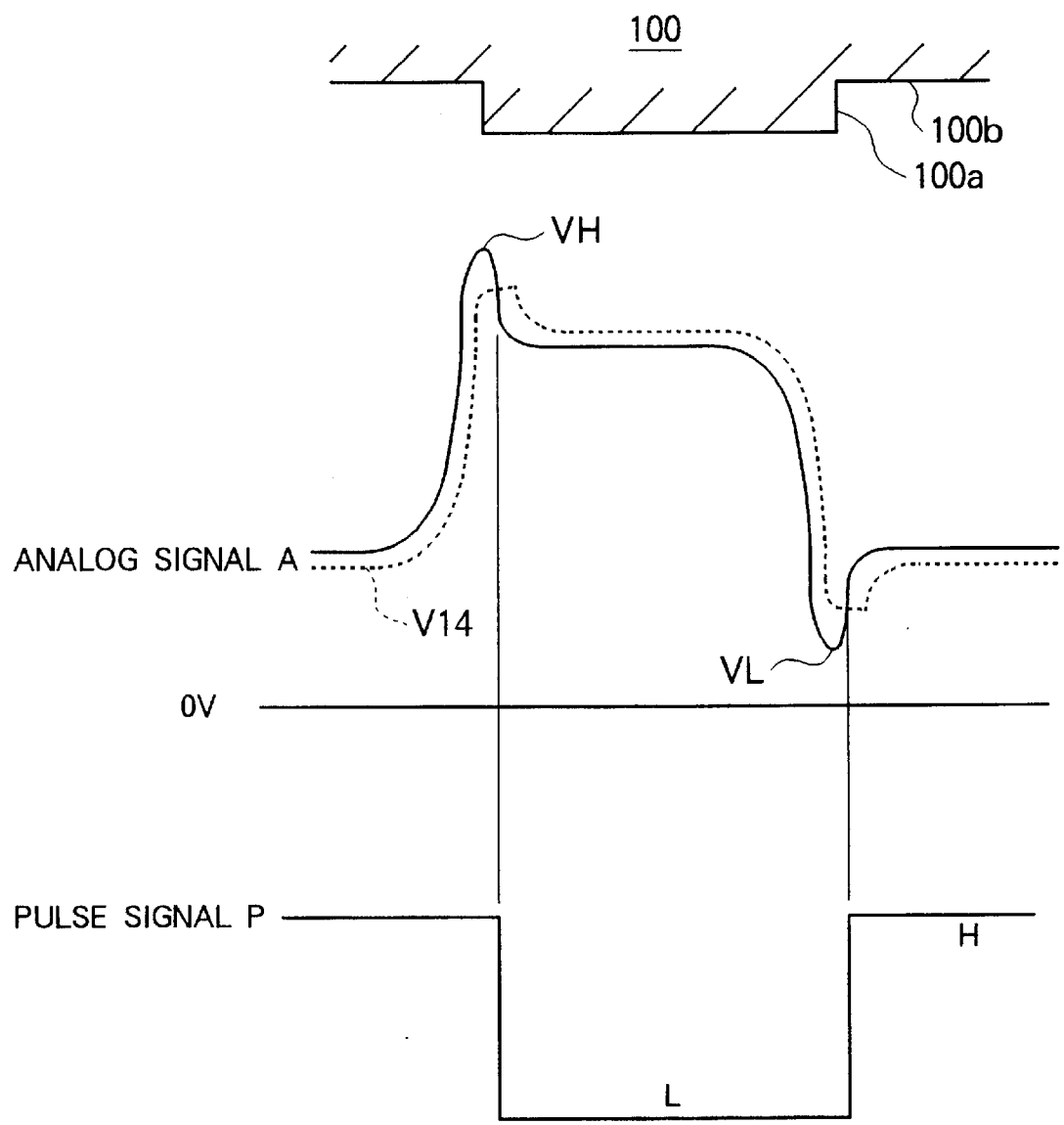
FIG. 11 is a waveform diagram for describing the pulse waveform processing operation for a typical analog signal.
Figure 12:
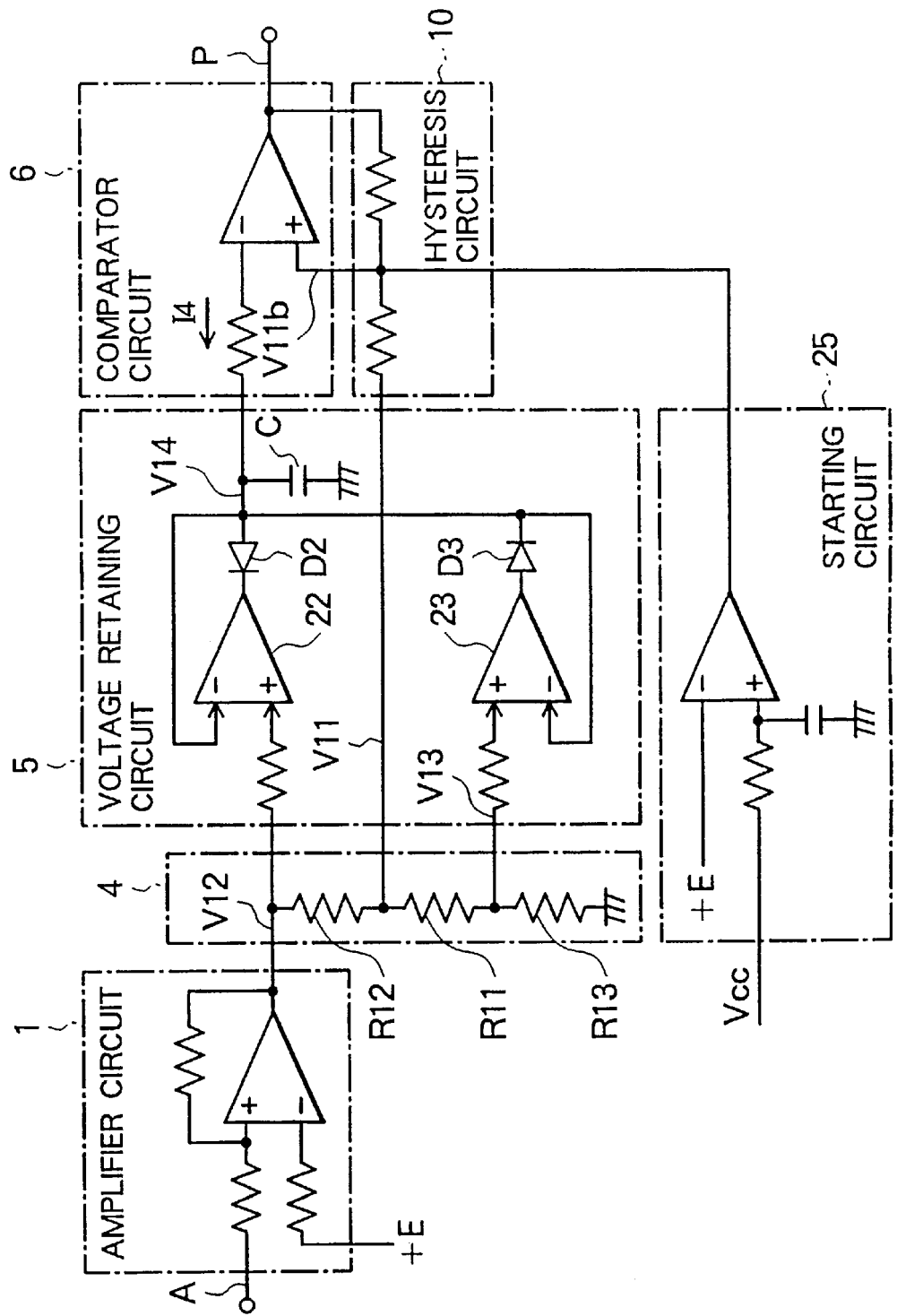
FIG. 12 is a circuit diagram illustrating an example of a conventional waveform processing circuit.
Figure 13:
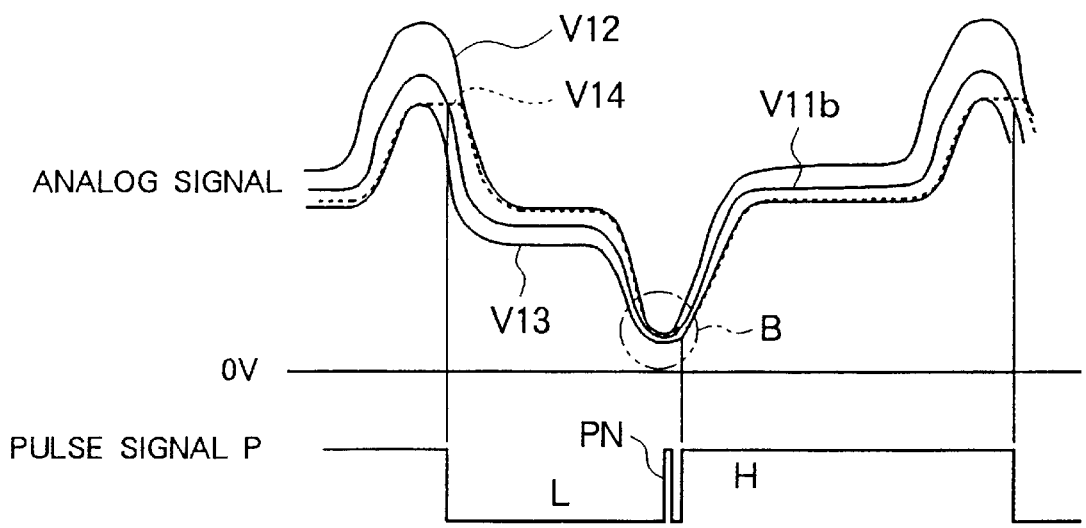
FIG. 13 is a waveform diagram for describing the waveform processing operation by the conventional waveform processing circuit.
Figure 14:
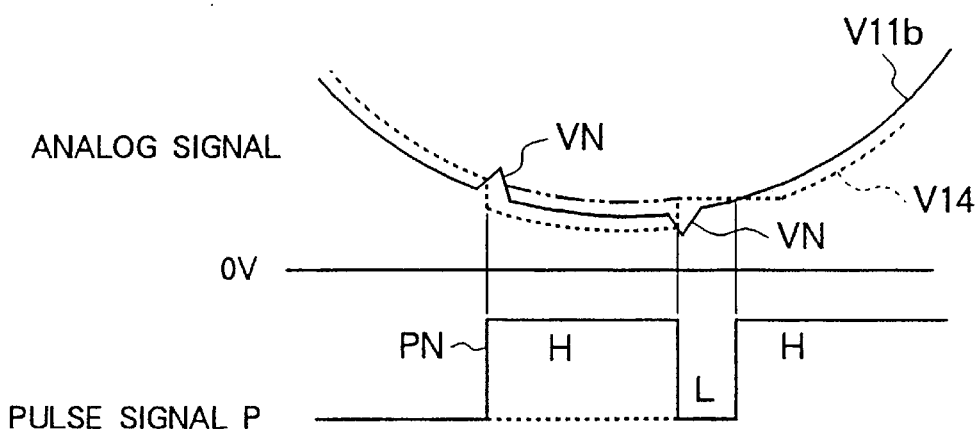
FIG. 14 is a waveform diagram showing an enlarged view of the area indicated by a chain line in FIG. 13.
Figure 15:
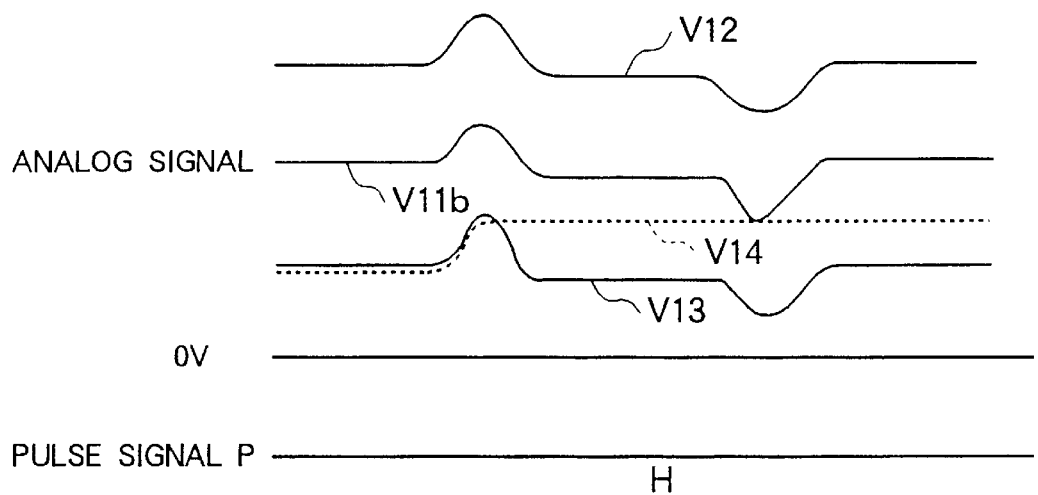
FIG. 15 is a waveform diagram for describing the waveform processing operation by a conventional magnetic detecting apparatus when the amplitude level of an analog signal is low.

First, when the magnetic body 100 shown in FIG. 4 and FIG. 6 rotates in the direction of the arrow, the analog signals A1 and A2 based on the size of the gap G shown in FIG. 9 and FIG. 10 are generated at the midpoints 14a and 14b of the bridge circuit 14.

The analog signals A1 and A2 are differentially amplified in DC at a predetermined amplification factor via the operational amplifiers 31 and 32 in the amplifier circuit 1A and they are output as the voltage signal V1 from the amplifier circuit 1A.

Then, the voltage signal V1 is supplied to the level shifting circuit 4A; the level shifting circuit 4A outputs new voltage signals V2 and V3 which have been offset upward or downward by a certain DC voltage or predetermined voltage determined by the product of the constant current I1 generated by the constant-current circuits 41 and 42 and the resistances of the resistors R1 and R2.

Thus, three different voltage signals, i.e. analog signals, V1, V2, and V3, which differ only in their DC component, are generated in the level shifting circuit 4A.

Next, the voltage signals V2 and V3 are applied to the voltage retaining circuit 5A, which alternately retains the minimum value of the voltage signal V2 and the maximum value of the voltage signal V3 as previously described.

This causes the voltage retaining circuit 5A to output the reference voltage signal V4, which nearly follows the voltage signal V1, and apply it to the inverting input terminal (−) of the comparator circuit 6A.

The comparator circuit 6A compares the magnitude of the voltage signal V1b resulting from adding the hysteresis to the voltage signal V1 with the magnitude of the reference voltage signal V4, and it issues the pulse signal P which has been binarized to the high and low levels.

At this time, in the hysteresis generating circuit 10A, the hysteresis width of the voltage signal V1b is set according to the pulse signal PA which is phase-inverted from the pulse signal P and which is received from the comparator 6A.

Figure 2:
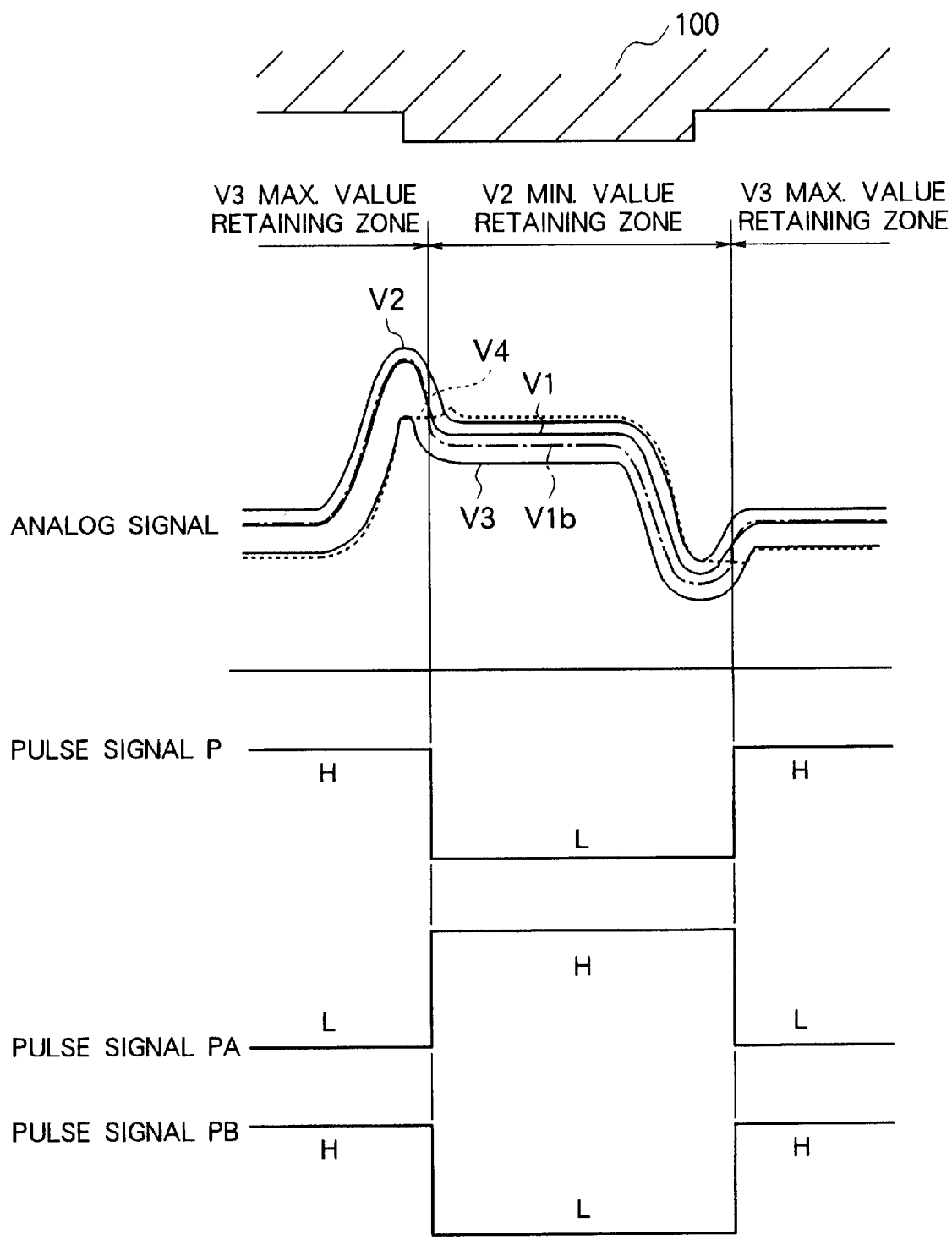
FIG. 2 is a waveform diagram illustrative of voltage signals and pulse signals for describing the operation of the first embodiment of the present invention.

As illustrated in FIG. 2, only while the pulse signal PA is at the high level, i.e. only during the period wherein the minimum value of the voltage signal V2 is retained, the switching circuit S1 in the hysteresis generating circuit 10A is closed, i.e. turned ON, to actuate the constant-current circuit 43.

When the constant-current circuit 43 is actuated, the constant current I2 is passed to the ground via resistor R10.

This causes the voltage signal V1b applied to the comparator circuit 6A to be set to the voltage level obtained by decreasing the voltage signal V1 by the predetermined DC voltage, which is decided by the constant current I2 and the resistance of the resistor R10.

When the pulse signal PA is at the low level, i.e. during the period in which the maximum value of the voltage signal V3 is retained, the switching circuit S1 in the hysteresis generating circuit 10A is opened, i.e. turned OFF; therefore, the constant current I2 does not flow and the voltage signal V1b is at the same voltage level as the voltage signal V1.

The output terminal of the voltage retaining circuit 5A is connected to the discharging circuit 13A; the discharging circuit 13A is driven in response to the pulse signal PB, which has the same phase as that of the pulse signal P, received from the comparator 6A.

As illustrated in FIG. 2, the pulse signal PB is at the low level in the period during which the minimum value of the voltage signal V2 is retained; it is switched to the high level only in the period during which the maximum value of the voltage signal V3 is retained, to close or turn ON the switching circuit S2 in the discharging circuit 13A so as to activate the constant-current circuit 44.

While the pulse signal PB is at the low level, i.e. during the period in which the minimum value of the voltage signal V2 is retained, the switching circuit S2 is opened, i.e. OFF, and no constant current I3 for discharging by the constant-current circuit 44 is allowed to flow; therefore, the reference voltage signal V4, indicated by the dashed line in FIG. 2, slightly rises after the fall of the pulse signal PB due to the charging primarily by the leakage current I4 produced by the comparator circuit 6A.

While the pulse signal PB is at the high level, i.e. during the period in which the maximum value of the voltage signal V3 is retained, the switching circuit S2 is closed, i.e. turned ON, to actuate the constant-current circuit 44, causing the constant current I3 to be discharged from the output terminal of the voltage retaining circuit 5A to ground.

Hence, the reference voltage signal V4 does not rise due to the leakage current I4 and it is maintained nearly at a constant value.

Figure 16:
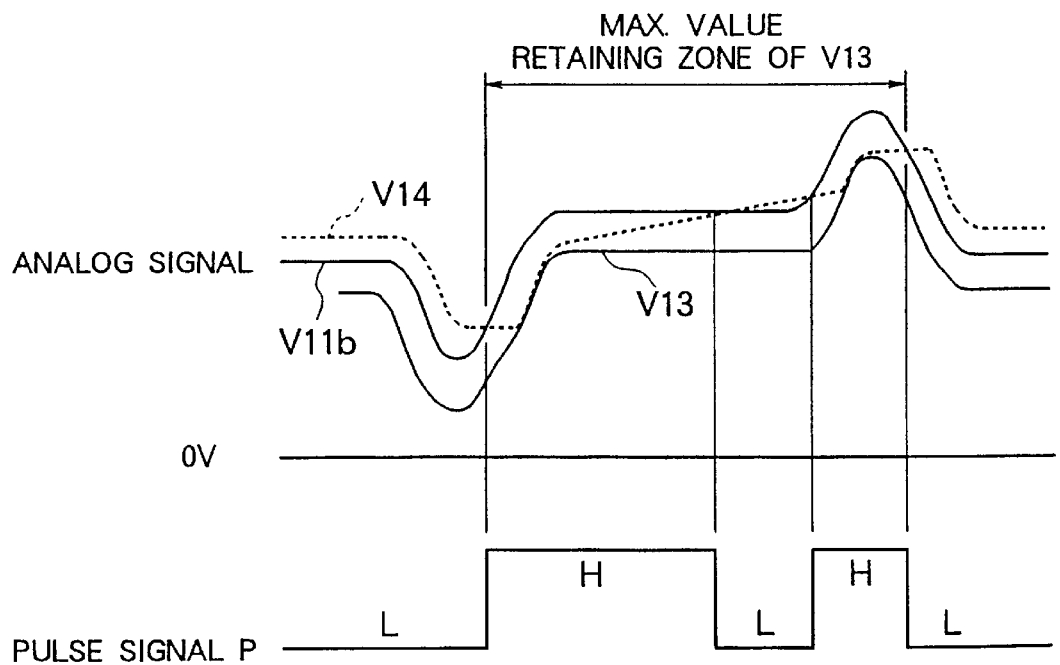
FIG. 16 is a waveform diagram for describing the waveform processing operation by the conventional magnetic detecting apparatus when the frequency of the analog signal is low.

In FIG. 2, the reference voltage signal V4 slightly drops after the rise of the pulse signal PB due to the constant current I3 for discharging; however, this happens during the maximum value retaining period relative to the voltage signal V3 of the minimum level. Therefore, no malfunction illustrated in FIG. 16 will occur and there should be no problem.

As shown in FIG. 1, the use of the level shifting circuit 4A combining the resistors R1 and R2 and the constant-current circuits 41 and 42 makes it possible to maintain the level shifting amount at a fixed value at all times rather than being influenced by the level switching of the analog signals A1 and A2 which is especially noticeable in the case where the giant magnetoresistive element 20 is employed. This enables a highly accurate pulse signal P to be obtained by the binarizing processing based on appropriate voltage shift amounts.

Furthermore, the use of the hysteresis generating circuit 10A, combining the resistor R10 and the constant-current circuit 43, maintains the hysteresis at the fixed value, thus enabling a highly accurate pulse signal P to be obtained by accurate binarizing processing.

Since the output terminal of the voltage retaining circuit 5A is connected to the discharging circuit 13A, even when the frequencies of the analog signals A1 and A2 are low, the influences of the leakage current I4 from the comparator circuit 6A can be suppressed to retain the reference voltage signal V4. This enables the ends of the projecting section 100a to be positively detected regardless of the rotational speed of the magnetic body 100.

Hence, a highly accurate pulse signal P based on precise waveform processing can be obtained including the case where the magnetic body 100 is at rest.

Moreover, since the constant-current circuit 44 is employed as the voltage limiting means for discharging the very small leakage current I4, the current capacity of the constant-current circuit 44 may be small, permitting a reduced size of the discharging circuit 13A.

Second Embodiment

In the first embodiment described above, the constant-current circuit 44 has been used as the voltage limiting means for restraining the voltage rise of the reference voltage signal V4; however, a resistor having high resistance may be used instead.

Figure 3:
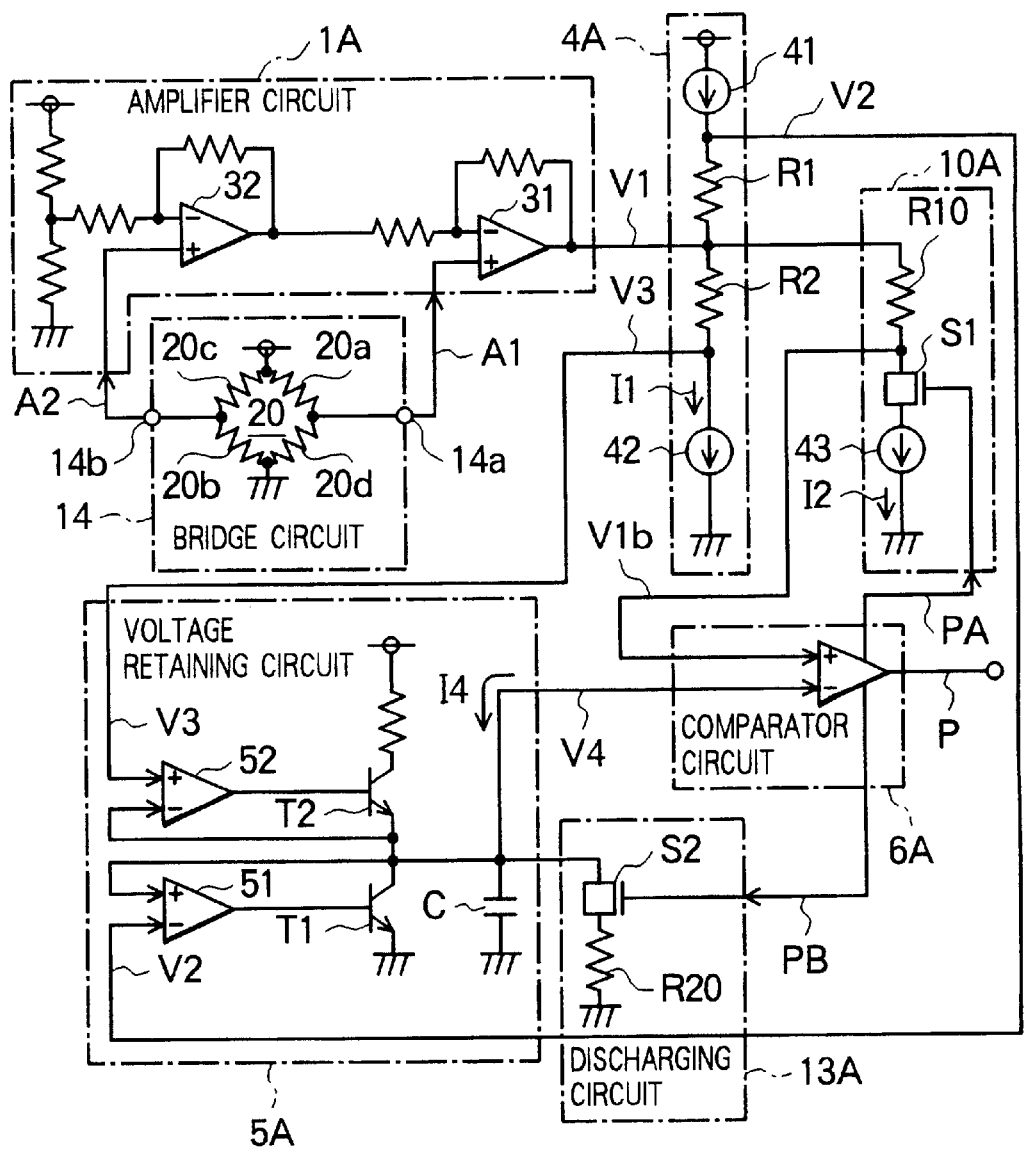
FIG. 3 is a circuit diagram showing the essential section of a second embodiment of the present invention.

FIG. 3 is a circuit diagram illustrative of the waveform processing circuit according to a second embodiment of the present invention wherein a resistor is used as the voltage limiting means in the discharging circuit.

The second embodiment is identical to the first embodiment described above except that a resistor R20 is inserted in place of the constant-current circuit 44, which is shown in FIG. 1, in the discharging circuit 13B in the FIG. 3.

In this case, the resistance value of the resistor R20 connected in series to a switching circuit S2 is set, for example, to 1 MΩ or more so as to properly discharge a very small leakage current I4 to ground.

Hence, even when the rotational speed of the magnetic body 100, shown in FIG. 4, and the frequencies of the analog signals A1 and A2 are low, the rise of the reference voltage signal V4 caused by the leakage current I4 can be controlled so as to issue accurate pulse signal P as in the first embodiment.

When the resistor R20 is used as shown in FIG. 3, reduced cost of the apparatus can be accomplished because the resistor is cheaper than the aforesaid constant-current circuit 44 although the apparatus inevitably becomes larger since the resistor is required to provide higher resistance.

In the embodiments given above, the rotation detecting apparatus 101 has been taken as the example; however, the magnetic body 100 is not limited to a rotating body. The present invention can be applied to magnetic detecting apparatus intended for the detection of any other moving magnetic bodies to obtain the same operations and advantages.

Thus, according to one aspect of the present invention, the magnetic detecting apparatus is equipped with: a giant magnetoresistive element disposed to be opposed to a magnetic body, a magnet for applying a bias magnetic field to the giant magnetoresistive element, and a waveform processing circuit for waveform-shaping an analog signal, which is output from the giant magnetoresistive element as the magnetic body moves, into a pulse signal; wherein the waveform processing circuit includes an amplifier circuit for amplifying the analog signal obtained from the giant magnetoresistive element in synchronization with the movement of the magnetic body; a level shifting circuit which is connected to an output terminal of the amplifier circuit and which generates a first voltage signal output from the amplifier circuit, a second voltage signal which is higher than the first voltage signal by a first predetermined voltage, and a third voltage signal which is lower than the first voltage signal by a second predetermined voltage; a voltage retaining circuit which alternately retains the minimum value of the second voltage signal and the maximum value of the third voltage signal as a reference voltage signal; and a comparator circuit which compares the first voltage signal with the reference voltage signal and issues a pulse signal; the level shifting circuit being composed of first and second resistors which are respectively inserted to correspond to the first and second predetermined voltages between the output terminal of the first voltage signal and the output terminals of the second and third voltage signals, and a constant-current circuit which is connected in series to the first and second resistors. Thus, the voltage shift of the level shifting circuit is fixed regardless of the levels of the analog signals so as to achieve a magnetic detecting apparatus capable of performing accurate waveform processing without being affected by noise signals or the like.

According to another aspect of the present invention, the magnetic detecting apparatus described above is equipped with: a hysteresis generating circuit composed of a resistor inserted between the output terminal of the first voltage signal and the input terminal of the comparator circuit, a constant-current circuit inserted between one end of the resistor and ground, and a switching circuit connected in series to the constant-current circuit; wherein the switching circuit is closed by an output signal of the comparator circuit, which output signal corresponds to the zone wherein the minimum value of the second voltage signal is retained and it sets the voltage level of the first voltage signal supplied to the comparator circuit to a voltage signal which is lower than the first voltage signal by a third predetermined voltage, and the third predetermined voltage is set to a level lower than the second predetermined voltage. This enables the hysteresis width in the hysteresis generating circuit to be fixed, thus achieving a magnetic detecting apparatus capable of performing accurate waveform processing.

According to yet another aspect of the present invention, the aforesaid magnetic detecting apparatus is further equipped with: a switching circuit inserted between the output terminal of the voltage retaining circuit and ground, and a discharging circuit constituted by voltage limiting means connected in series with the switching circuit; wherein the switching circuit is closed by an output signal of the comparator circuit, which output signal corresponds to the zone wherein the maximum value of the third voltage signal is retained. Therefore, the influences exerted by the leakage current from the comparator circuit can be suppressed, making it possible to achieve a magnetic detecting apparatus which is capable of performing accurate waveform processing even on analog signals of low frequencies.

In a preferred form of the invention, the voltage limiting means is constituted by the constant-current circuit; therefore, a magnetic detecting apparatus with a physically smaller discharging circuit can be accomplished.

In a further preferred form of the invention, the voltage limiting means is constituted by the resistor; therefore, reduced cost of a magnetic detecting apparatus can be attained.

What is claimed is:

1. A magnetic detecting apparatus comprising:

a giant magnetoresistive element disposed to be opposed to a magnetic body;

a magnet for applying a bias magnetic field to the giant magnetoresistive element; and a waveform processing circuit for waveform-shaping an analog signal, which is output from the giant magnetoresistive element as the magnetic body moves, into a pulse signal;

wherein the waveform processing circuit comprises:

an amplifier circuit for amplifying the analog signal obtained from the giant magnetoresistive element in synchronization with the movement of the magnetic body;

a level shifting circuit connected to an output terminal of the amplifier circuit, the level shifting circuit generating a first voltage signal that is the same as the output from the amplifier circuit, a second voltage signal that is higher than the first voltage signal by a first predetermined voltage, and a third voltage signal that is lower than the first voltage signal by a second predetermined voltage;

a voltage retaining circuit that alternately retains the minimum value of the second voltage signal and the maximum value of the third voltage signal as a reference voltage signal; and a comparator circuit that compares the first voltage signal with the reference voltage signal and outputs a pulse signal;

the level shifting circuit comprising first and second resistors that are respectively disposed between the output terminal of the first voltage signal and the output terminals of the second and third voltage signals, and a first constant-current circuit connected in series with the first and second resistors.

2. A magnetic detecting apparatus according to claim 1, further comprising:

a hysteresis generating circuit comprising:

a third resistor disposed between the output terminal of the first voltage signal and an input terminal of the comparator circuit;

a second constant-current circuit disposed between one end of the third resistor and ground; and a first switching circuit connected in series with the second constant-current circuit;

wherein the first switching circuit is closed by an output signal of the comparator circuit, and wherein the output signal of the comparator corresponds to the period when the voltage retaining circuit is retaining the minimum value of the second voltage signal so that the voltage level of the first voltage signal supplied to the comparator circuit is set to a voltage signal that is lower than the first voltage signal by a third predetermined voltage, and wherein the third predetermined voltage is set to a level lower than the second predetermined voltage.

3. A magnetic detecting apparatus according to claim 1, further comprising:

a second switching circuit disposed between the output terminal of the voltage retaining circuit and ground; and a discharging circuit comprising voltage limiting means connected in series with the second switching circuit;

wherein the second switching circuit is closed by an output signal of the comparator circuit, and wherein the output signal corresponds to the period when the voltage retaining circuit is retaining the maximum value of the third voltage signal.

4. A magnetic detecting apparatus according to claim 3, wherein the voltage limiting means comprises a third constant-current circuit.

5. A magnetic detecting apparatus according to claim 3, wherein the voltage limiting means comprises a fourth resistor.

* * * * *